United States Patent
Nakagawa (10) Patent No.: US 8,654,440 B2
(45) Date of Patent: Feb. 18, 2014

(54) OPTICAL AMPLIFICATION MODULE AND OPTICAL SWITCH DEVICE

(75) Inventor: Goji Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 181 days.

(21) Appl. No.: 13/097,425

(22) Filed: Apr. 29, 2011

(65) Prior Publication Data

US 2012/0019903 A1    Jan. 26, 2012

(30) Foreign Application Priority Data

Jul. 23, 2010    (JP) .................................. 2010-166430

(51) Int. Cl.
*H01S 5/022*    (2006.01)

(52) U.S. Cl.
USPC ................................. 359/344; 385/89; 385/92

(58) Field of Classification Search
USPC .................................. 359/344; 385/89, 92, 93
See application file for complete search history.

(56) References Cited

U.S. PATENT DOCUMENTS

| | | | |
|---|---|---|---|
| 5,898,801 A | 4/1999 | Braun et al. | |
| 7,325,985 B2 * | 2/2008 | Takagi | 385/94 |
| RE41,247 E | 4/2010 | Braun et al. | |
| 7,785,020 B2 * | 8/2010 | Kim et al. | 385/92 |
| 8,167,505 B2 * | 5/2012 | Oki | 385/92 |
| 2002/0196497 A1 | 12/2002 | LoCascio et al. | |
| 2007/0031093 A1 * | 2/2007 | Takagi | 385/93 |

FOREIGN PATENT DOCUMENTS

| | | |
|---|---|---|
| EP | 1 304782 | 4/2003 |
| JP | 2007-298738 | * 11/2007 |
| WO | WO 2007/060469 | 5/2007 |

OTHER PUBLICATIONS

European Patent Office Communication mailed Nov. 14, 2011 for corresponding European Patent Application No. 11165663.3.

* cited by examiner

*Primary Examiner* — Mark Hellner
(74) *Attorney, Agent, or Firm* — Staas & Halsey LLP (57) ABSTRACT

An optical amplification module has a semiconductor optical amplifier, a package accommodating the semiconductor optical amplifier, and a first connector and a second connector holding respective collimator lenses and arranged in parallel on the package. A sum of bend radii of the first optical fiber and the second optical fiber is greater than a space between the first connector and the second connector.

4 Claims, 11 Drawing Sheets

OPTICAL AMPLIFICATION MODULE AND OPTICAL SWITCH DEVICE

CROSS-REFERENCE TO RELATED APPLICATIONS

This application is based upon and claims the benefit of priority of the prior Japanese Patent Application No. 2010-166430 filed on Jul. 23, 2010, the entire contents of which are incorporated herein by reference.

FIELD

The embodiments discussed herein are directed to an optical amplification module and an optical switch device.

BACKGROUND

There are optical amplification modules with semiconductor amplifiers. Such an optical amplification module has a package accommodating a semiconductor optical amplifier, a first optical fiber and a second optical fiber optically connected to the semiconductor optical amplifier, and a first connector and a second connector connected to the first optical fiber and the second optical fiber, respectively. A light beam to be inputted to the semiconductor optical amplifier passes through the first connector via the first optical fiber. A light beam outputted from the semiconductor optical amplifier is connected to the second optical fiber via the second connector. Patent Document 1 discloses a technique relating to such the optical amplification module.

[Patent Document 1] Japanese Patent Application Publication No. 2007-298738

When a plurality of such connectors are disposed in series so as to sandwich the package, the dimensions of the optical amplification module increase.

SUMMARY

According to an aspect of the embodiment, an optical amplification module includes a semiconductor optical amplifier, a package that accommodates the semiconductor optical amplifier, and a first connector and a second connector that hold respective collimator lenses and are arranged in parallel on the package.

According to another aspect of the embodiment, an optical switch device includes a first optical amplification module and a second optical amplification module, and an optical dividing unit capable of distributing inputted light to the first and second optical amplification modules, wherein at least one of the first optical amplification module and the second optical amplification module has a semiconductor optical amplifier, a package accommodating the semiconductor optical amplifier, a first connector and a second connector holding respective collimator lenses and arranged in parallel on the package, and a first optical fiber and a second optical fiber connected to the first connector and the second connector, respectively, and a sum of bend radii of the first optical fiber and the second optical fiber is greater than a space between the first connector and the second connector.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Hereinafter, embodiments will be described with reference to the accompanying drawings.

Figure 1A:
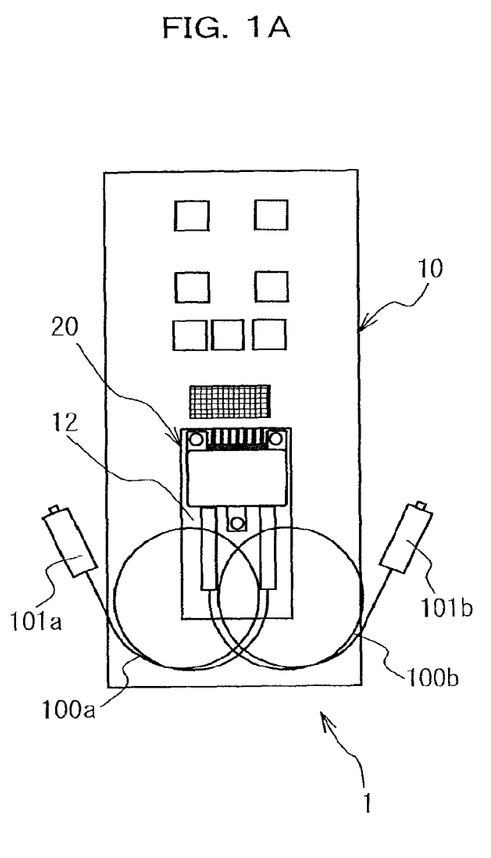
FIGS. 1A and 1B are diagrams illustrating an optical amplification module according to an embodiment.
Figure 1B:
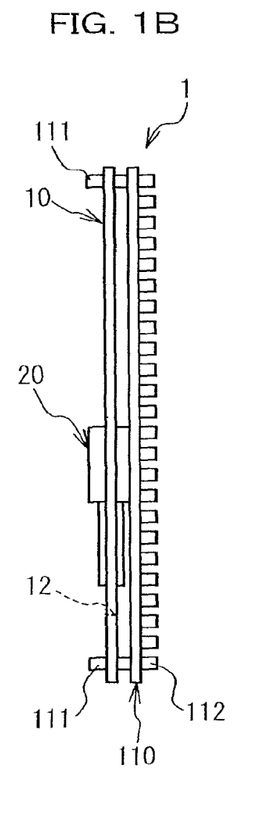

FIGS. 1A and 1B are diagrams illustrating an optical amplification module according to an embodiment. FIG. 1A illustrates a front view of the optical amplification module 1, while FIG. 1B illustrates a side view of the same. The optical amplification module 1 includes a printed substrate 10, an optical component 20 and a heat radiating plate 110. The printed substrate 10 is a hard printed substrate. A plurality of electronic components such as capacitor, semiconductor chip and the like are mounted on the printed substrate 10. An opening 12 is formed in the printed substrate 10. On the back side of the printed substrate 10, provided is the heat radiating plate 110. The printed substrate 10 and the heat radiating plate 110 are fixed together by screws 111. The heat radiating plate 110 is made of metal. On the backside of the heat radiating plate 110, there are formed a plurality of fins 112 to enhance radiation of heat. An optical component 20 is fixed on the front side of the heat radiating plate 110.

The optical component 20 is placed in the opening 12 of the printed substrate 10. The optical component 20 is conductively connected to patterns formed on the printed substrate 10. An end of each of optical fibers 100a and 100b is connected to the optical component 20. Connectors 101a and 101b for optically connecting the optical amplification module 1 to another device are disposed on the other ends of the optical fibers 100a and 100b. The extra length processing has been performed on the optical fibers 100a and 100b so that each of the optical fibers 100a and 100b is wound with a predetermined diameter. An optical coupler may be provided to either one of the optical fibers 100a and 100b to branch the light beams into two, a connector may be connected to one of the branched beams, while a photodiode may be connected to the other one of the branched beams. The optical fibers 100a and 100b may be immune from the extra length processing.

Figure 2:
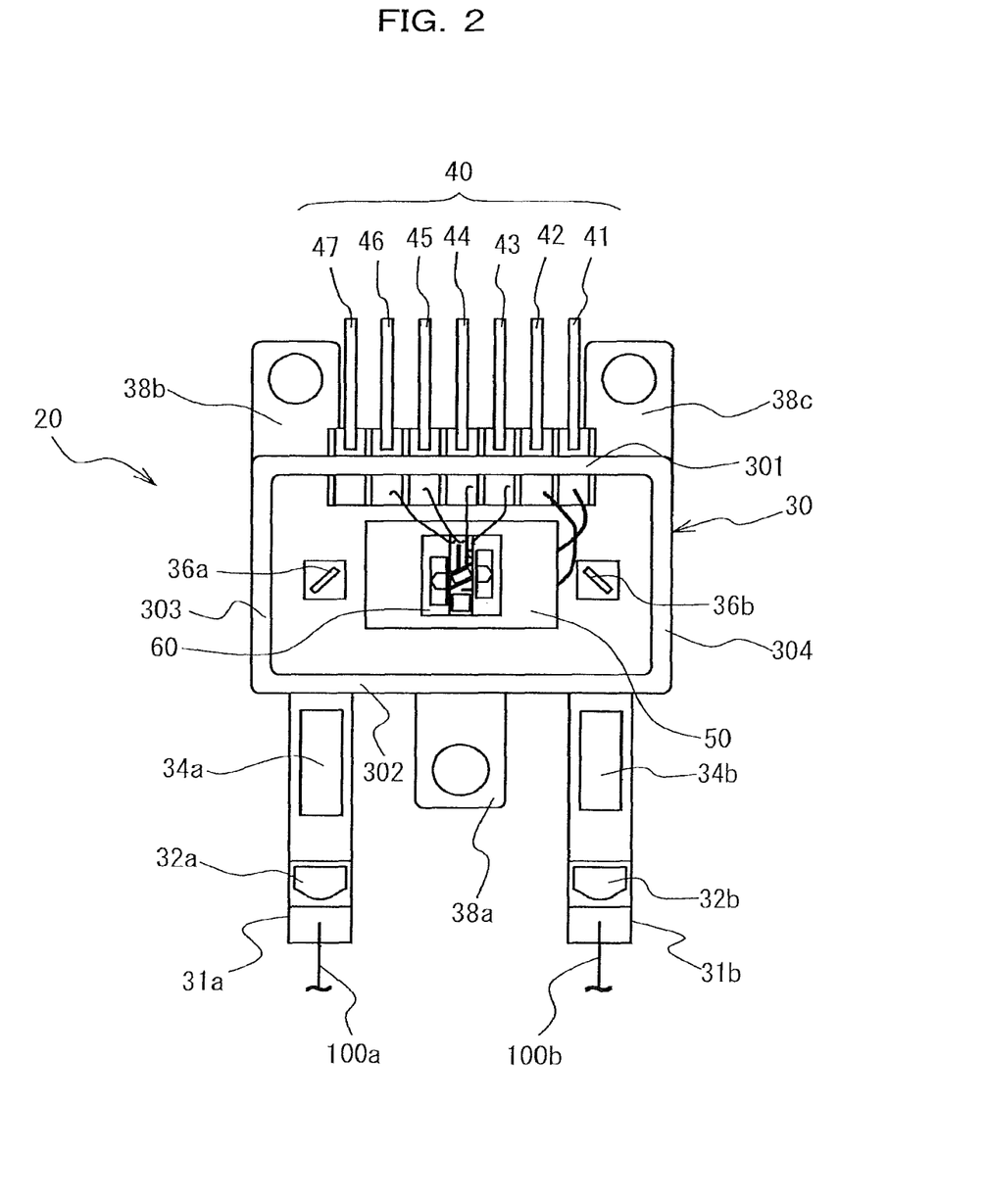
FIG. 2 is a diagram illustrating an internal structure of an optical component.

FIG. 2 is a diagram illustrating an internal structure of the optical component 20. The optical component 20 includes a package 30, a terminal group 40, a cooler 50 (for example, cooler), a stem 60, etc. The package 30 has a substantially rectangular shape, accommodating therein the cooler 50, the stem 60, etc. The package 30 has side walls 301 to 304 which demarcate a space in which the cooler 50, the stem 60, etc. are accommodated. The side walls 301 and 302 face each other, while the side walls 303 and 304 face each other. A plurality of leg parts 38a to 38c are disposed to the package 30 to fix the package 30 to the heat radiating plate 110. A screw hole is formed in each of the leg parts 38a to 38c to fix the package 30 to the heat radiating plate 110. The leg part 38a is formed so as to protrude from the side wall 302. The leg parts 38b and 38c are formed so as to protrude from the side wall 301.

Connectors 31a and 31b are disposed to the package 30. The connectors 31a and 31b are disposed on the side of the side wall 302, arranged in parallel. The connector 31a holds a collimator lens 32a and an optical isolator 34a, which are optical components. The connector 31b holds a collimator lends 32b and an optical isolator 34b, which are optical components. The optical isolators 34a and 34b prevent feedback light. The optical fibers 100a and 100b are inserted to the connectors 31a and 31b, respectively.

Mirrors 36a and 36b are disposed in the package 30. The mirror 36a ensures an optical path between the optical fiber 100a and a semiconductor optical amplifier to be described later, while the mirror 36b ensures an optical path between the semiconductor optical amplifier and the optical fiber 100b. Whereby, the optical fibers 100a and 100b, and the semiconductor optical amplifier are optically connected. Light beams radiated onto the mirror 36a and 36b are reflected at an approximately right angle. Each of the mirrors 36a and 36b are placed on seating parts in the package 30.

The terminal group 40 is disposed so as to penetrate the side wall 301. The terminal group 40 includes a plurality of terminals 41 to 47 arranged in parallel. Each of the terminals 41 to 47 includes a flat plate part penetrating the side wall 301, and a lead part conductively fixed to the flat plate part outside the package 30. The terminal group 40 electrically connects electronic components placed in the package 30 and the printed substrate 10. The leg parts 38b and 38c, and the terminal group 40 stand side by side. The cooler 50 is set in the center of the package 30. The cooler 50 is conductively connected to the terminals 41 and 42 in the terminal group 40. The cooler 50 is, for example, a Peltier element. The stem 60 is placed on the cooler 50. The stem 60 is made of metal.

The terminals 41 to 47 are arranged in parallel, and extend in the same direction. The terminal group 40, and the connectors 31a and 31b are disposed on both sides of the package 30. The connectors 31a and 31b extend in a direction opposite to a direction in which the terminals 41 to 47 extend. The leg part 38a is disposed between the connectors 31a and 31b, and extends in the approximately same direction as the connectors 31a and 31b. The leg parts 38b and 38c are disposed so as to sandwich the terminal group 40, and extend in the substantially same direction as the terminals 41 to 47.

Figure 3:
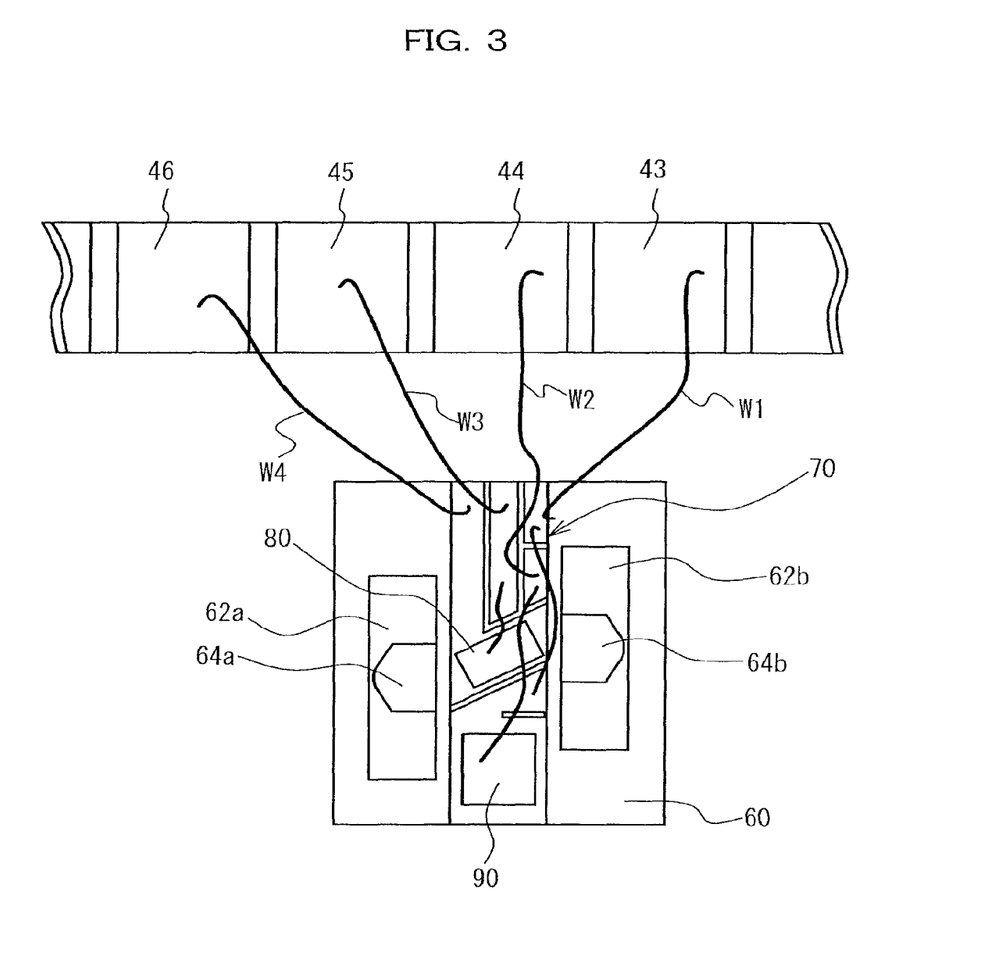
FIG. 3 is an enlarged view of a stem and neighboring portions thereof.

FIG. 3 is an enlarged view of the stem 60 and portions in the vicinity of the stem 60. As illustrated in FIG. 3, lens holders 62a and 62b are provided to the stem 60. The lens holders 62a and 62b hold the lens 64a and 64b, respectively. A carrier 70 is placed on the stem 60. On the carrier 70, mounted are a semiconductor optical amplifier 80 [hereinafter, referred to as an SOA (Semiconductor Optical Amplifier) element] and a temperature detector 90 (for example, temperature detector). A waveguide through which the light beam passes is formed in the center of the SOA element 80. The SOA element 80 can amplify an incident light beam and output the same. The SOA element 80 operates on the similar principle to semiconductor lasers to exert the optical amplifying action on an incident light beam from the outside, with the use of the gain function in the semiconductor active region by pouring the electric current.

The SOA element 80 has characteristics that output of a light beam therefrom varies according to the temperature. The temperature detector 90 is disposed adjacent to the SOA element 80. The temperature detector 90 is, for example, a thermistor. On the basis of a temperature detected by the temperature detector 90, a control circuit formed on the printed substrate 10 controls an electric current flowing to the cooler 50. In concrete, the electric current flowing to the cooler 50 is controlled so that the temperature detected by the temperature detector 90 is constant, whereby fluctuation in the temperature around the cooler 50 can be prevented. As this, the fluctuation in characteristics of a light beam outputted from the SOA element 80 is prevented. Incidentally, driving of the SOA element 80 is controlled by a driving circuit formed on the printed substrate 10.

Wires W1 to W4 are electrically connected to the terminals 43 to 46 by bonding. The wires W1 to W4 are electrically connected to patterns formed on the carrier 70 by bonding. The wires W1 to W4 are made of conductive metal, details of which will be described later.

A light beam radiated from the optical fiber 100a passes through the collimator lens 32a to be converted into collimated light beams. The converted collimated light beams pass through the optical isolator 34a, are reflected from the mirror 36a, pass through the collimator lens 64a, and are converged on an end surface of incidence of the SOA element 80. A part of the light beams converged on the end surface of incidence of the SOA element 80 passes through the waveguide, is amplified, and outputted from an end surface of output of the SCA element 80. The light beam outputted from the SOA element 80 are converted into collimated light beams by the collimator lens 64b, are reflected from the mirror 36b, pass through the optical isolator 34b and the collimator lens 32b and converged on an end surface of the optical fiber 100b. The SOA element 80 is obliquely positioned with respect to the optical axes of the collimator lenses 64a and 64b. In order to position the collimator lenses 64a and 64b close to the SOA element 80, the width of the carrier 70 in a direction from the collimator lens 64a toward the collimator lens 64b is narrowed. The carrier 70 has a substantially rectangular shape.

Figure 4:
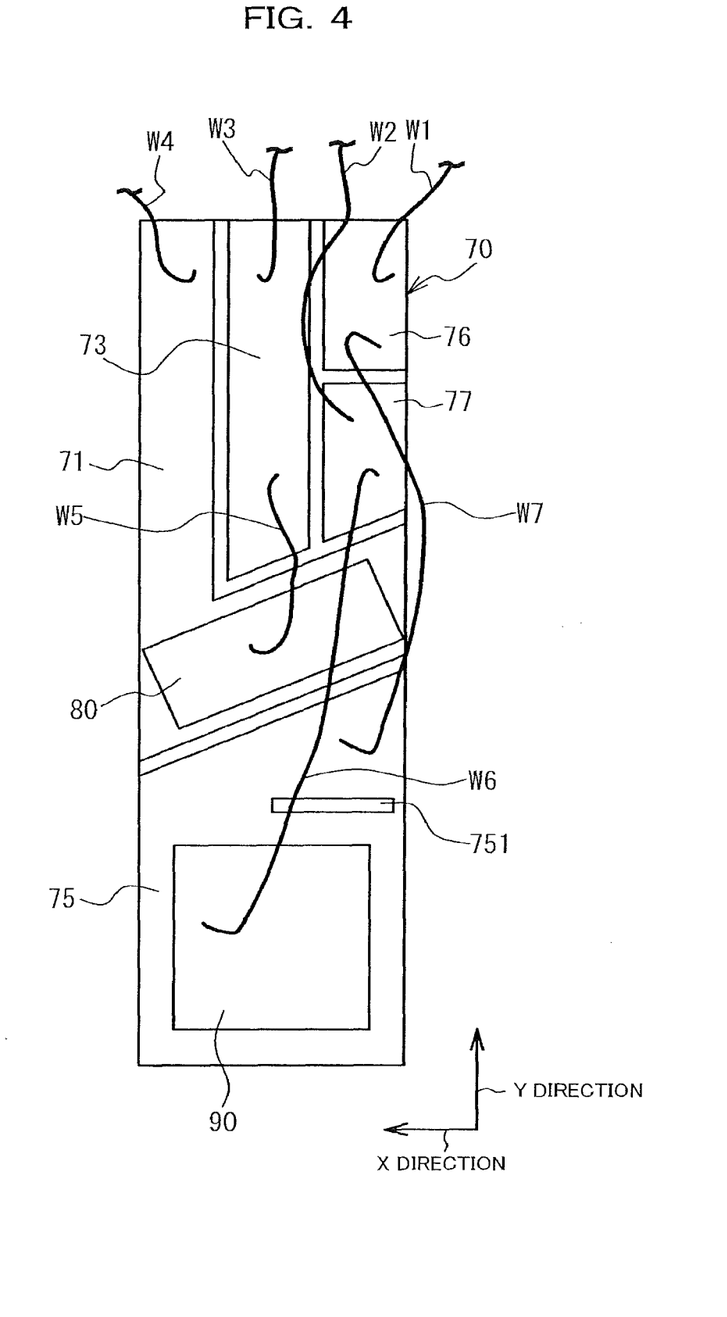
FIG. 4 is a diagram illustrating a carrier.

Next, the carrier 70 will be described. FIG. 4 is a diagram illustrating the carrier 70.

The carrier 70 includes an insulating substrate, and a plurality of patterns 71, 73, 75, 76 and 77 formed on the substrate. The carrier 70 has a substantially rectangular shape extending in the direction crossing a direction in which the terminals 41 to 47 are lined up. Here, a direction in which the carrier 70 extends is defined as y direction, while the width direction of the carrier 70 is defined as x direction. In the x direction, the terminals 41 to 47 are lined up.

The patterns 71, 73, 75, 76 and 77 are made of conductive metal such as gold, for example. The patterns 71, 73, 75, 76 and 77 are formed on an insulating substrate by evaporation, for example. The patterns 71, 73, 75, 76 and 77 are divided so as not to be able to conductively connected to one another.

The SOA element 80 is mounted on the pattern 71. In concrete, a terminal formed on the bottom part of the SOA element 80 and the pattern 71 are conductively connected by soldering. The pattern 71 includes a portion on which the SOA element 80 is mounted, and a portion extending from the former portion in the y direction. In other words, the pattern 71 extends up to an edge of the carrier 70 along which the terminal group 40 is disposed. An electrode is disposed on the upper end surface of the SOA element 80. The electrode of the SOA element 80 and the pattern 73 are conductively connected by the wire W5. The pattern 73 is adjacent to the pattern 71, and extends in the y direction. The pattern 73 extends up to the edge of the carrier 70 along which the terminal group 40 is disposed. The wire W3 conductively connects the terminal 45 to the pattern 73. The wire W4 conductively connects the terminal 46 to the pattern 71. The path of an electric current supplied to the SOA element 80 is the terminal 45, the wire W3, the pattern 73, the wire W5, the SOA element 80, the pattern 71, the wire W4 and the terminal 46 in this order. The path of the electric current supplied to the SOA element 80 may be in the reverse order.

The temperature detector 90 is mounted on the pattern 75. In concrete, a terminal disposed on the bottom surface of the temperature detector 90 is conductively connected to the pattern 75 by soldering. In the example illustrated in FIG. 4, the SOA element 80 is close to the terminal group 40, while the temperature detector 90 is apart from the terminal group 40. The pattern 75 is disposed opposite to the terminal group 40 with the SOA element 80 therebetween. The patterns 77 and 76 are arranged on the side of the terminal group 40 when looked from the SOA element 80. The patterns 77 and 76 are lined up in the y direction. The pattern 76 is closer to the terminal group 40 than the pattern 77. The pattern 75 and the pattern 76 are conductively connected to each other by the wire W7. The pattern 76 and the terminal 43 are conductively connected to each other by the wire W1. An electrode is disposed on the upper end surface of the temperature detector 90. The electrode disposed on the upper end surface of the temperature detector 90 is conductively connected to the pattern 77 by the wire W6. The wires W6 and W7 are bent so as not to contact to the electrode disposed on the upper surface of the SOA element 80. The pattern 77 and the terminal 44 are conductively connected to each other by the wire W2. A path of an electric current supplied to the temperature detector 90 is the terminal 44, the wire W2, the pattern 77, the wire W6, the temperature detector 90, the pattern 75, the wire W7, the pattern 76, the wire W1 and the terminal 43 in this order. The path of the electric current supplied to the temperature detector 90 may be in the reverse order. As this, the paths of the electric currents flowing to the SOA element 80 and the temperature detector 90 are ensured.

As illustrated in FIG. 4, a notched part 751 is formed in the pattern 75. On the notched part 751, no pattern is formed but the insulating substrate, which is the backing, is exposed. The notched part 751 is formed between a portion on the pattern 75 to which the wire W7 is connected and the temperature detector 90. A reason why the notched part 751 is formed is as follows. After the temperature detector 90 is mounted on the pattern 75, the wire W7 is bonded to the pattern 75 to be connected to the pattern 75. If solder exists at a portion to which the wire W7 is connected, there is a possibility that the wire W7 cannot be appropriately bonded. In order to prevent the melted solder from flowing to the portion to which the wire W7 is connected, the notched part 751 is formed.

The patterns 71, 73, 76 and 77 ensure electric connections between the SOA element 80 and the temperature detector 90, and the terminal group 40. Patterns for ensuring the electric connections between the SOA element 80 and the temperature detector 90, and the terminal group 40 are collected on the side of the terminal group 40. In concrete, the patterns 71 and 73 are arranged on the side of the terminal group 40 when looked from the SOA element 80. The patterns 76 and 77 are arranged on the side of the terminal group 40 when looked from the temperature detector 90. Whereby, the terminals 43 to 46 for supplying electric currents to the SOA element 80 and the temperature detector 90 can be arranged on the same side when looked from the SOA element 80 and the temperature detector 90. Details of this will be described later. "Arranged on the side of the terminal group 40 when looked from the SOA element 80" signifies that the pattern 71 on which the SOA element 80 is mounted and which extends up to the terminal group 40 is included.

Next, this embodiment will be described in comparison with an optical amplification module $1x$ having a structure differing from that of this embodiment.

Figure 5:
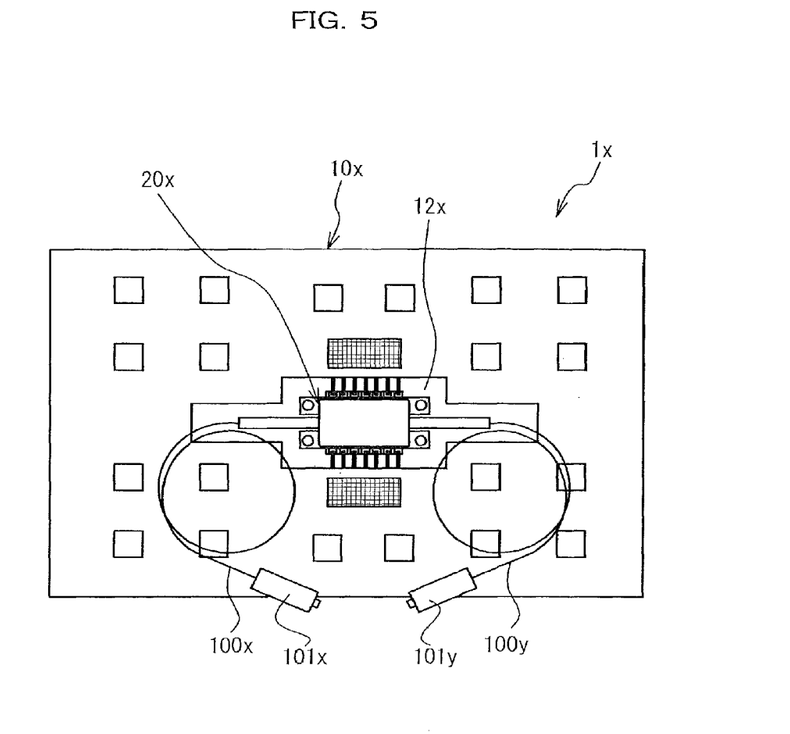
FIGS. 5 to 7 are diagrams illustrating an optical amplification module having a structure differing from a structure of the optical amplification module illustrated in FIGS. 1A, 1B, 2 and 3.
Figure 6:
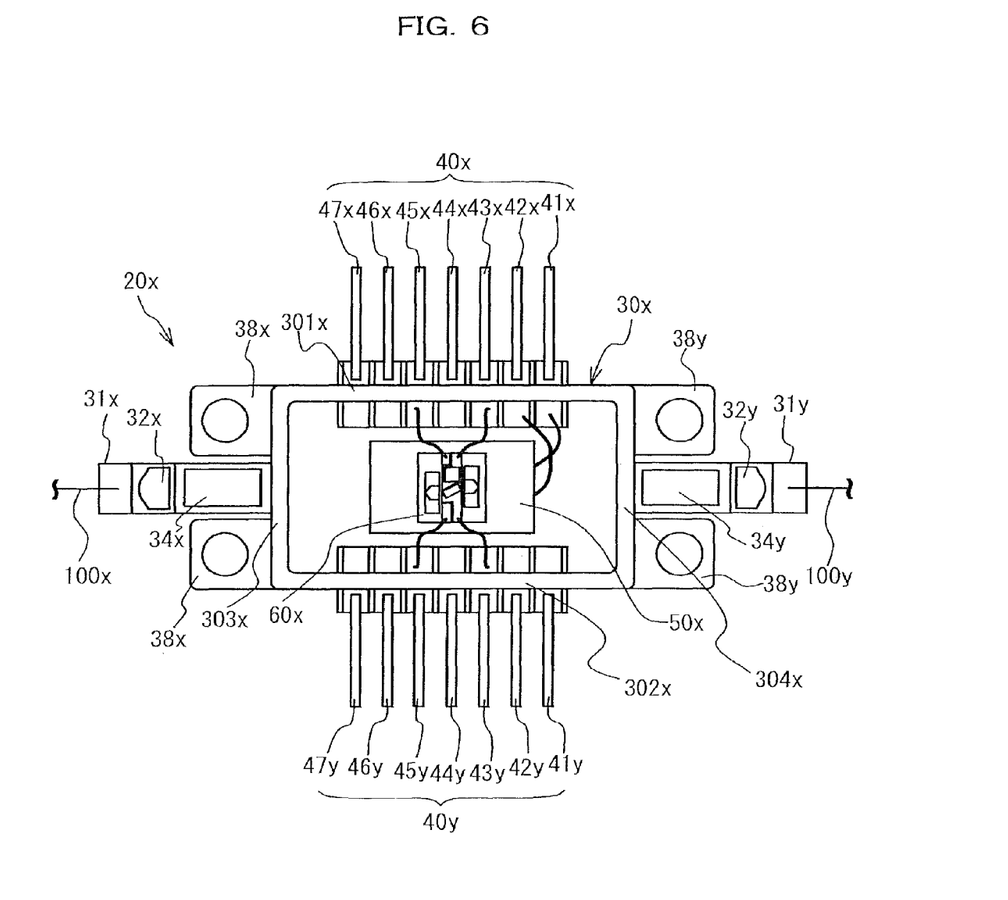
Figure 7:
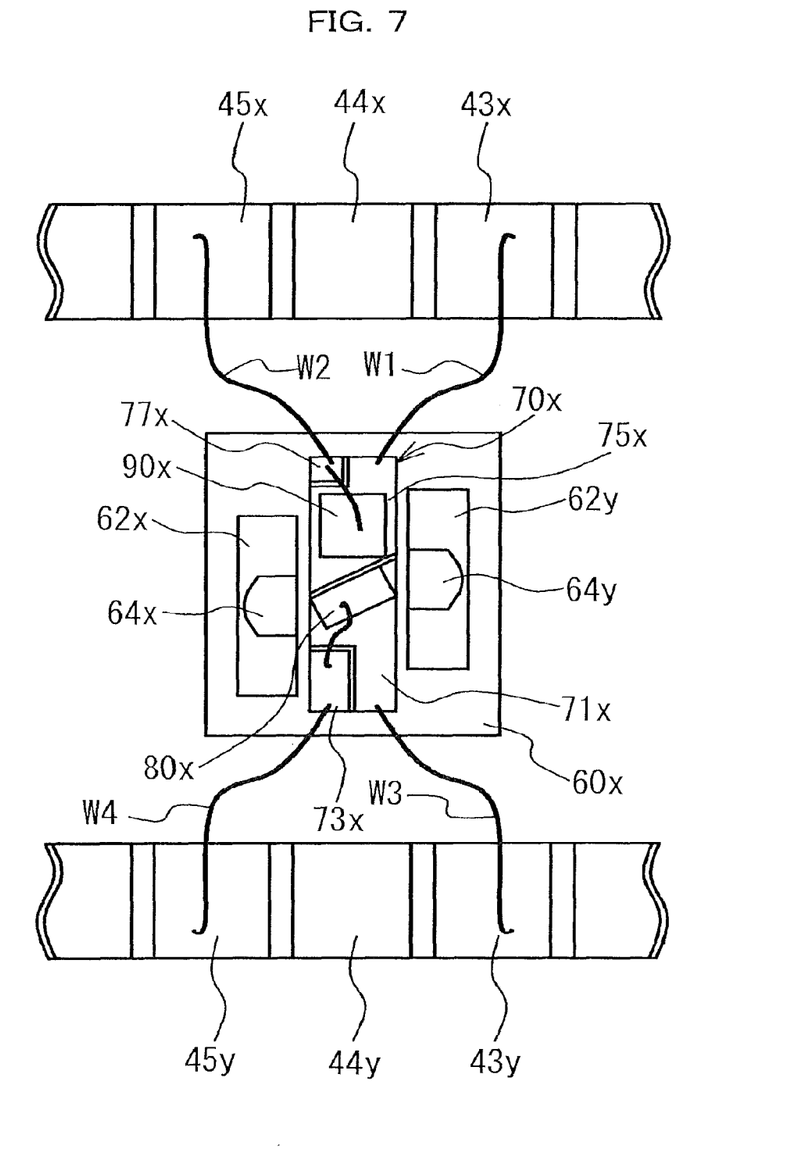

FIGS. 5 through 7 are diagrams illustrating the optical amplification module $1x$ having a structure differing from that of this embodiment. FIGS. 5 through 7 correspond to FIGS. 1A, 2 and 3, respectively. Like parts of the optical amplification module $1x$ are identified by similar reference numerals of the optical amplification module 1, duplicated descriptions on which are thus omitted.

As illustrated in FIGS. 5 and 6, connectors $31x$ and $31y$ are connected to side walls $303x$ and $304x$ which face each other, respectively, and arranged in series with a package $30x$ between. The connectors $31x$ and $31y$, and optical fibers $100x$ and $100y$ are positioned on both sides of the package $30x$. Therefore, an optical component is increased in dimensions, and the entire optical amplification module $1x$ is increased in dimensions, as well. Each of the optical fibers $100x$ and $100y$ has undergone the extra length processing so as to be wound with a predetermined diameter. Therefore, portions of the optical fibers $100x$ and $100y$ having undergone the extra length processing cause an increase in dimensions of the optical amplification module $1x$.

To the contrary, in the optical amplification module 1 according to this embodiment, the connectors $31a$ and $31b$ are arranged in parallel and connected to the same side wall 302, as illustrated in FIG. 2. For this reason, the dimensions of the optical component 20 are reduced and the dimensions of the entire optical amplification module 1 are reduced, as well. Since the connectors $31a$ and $31b$ are arranged in parallel, the portions of the optical fibers $100a$ and $100b$ having undergone the extra length processing are overlapped on one another. When the bend radius is equal to or larger than a predetermined value, the optical fiber has little transmission loss, but when the bend radius is smaller than the predetermined value, the transmission loss becomes large. For this reason, the minimum bend radius that causes little transmission loss is determined according to specifications (type) of the optical fiber. Accordingly, the dimensions of an extra length having undergone the extra length processing cannot be smaller than predetermined dimensions. In the optical amplification module 1 according to this embodiment, a sum of bend radii of the optical fibers $100a$ and $100b$ is larger than a space between the connectors $31a$ and $31b$ and the portions of the optical fibers $100a$ and $100b$ having undergone the extra length processing are overlapped on one another, whereby the space for the extra lengths is reduced.

As illustrated in FIG. 6, in the optical amplification module $1x$, a terminal group $40x$ is arranged on the side of a side wall $301x$ of the package $30x$, while a terminal group $40y$ is arranged on the side of a side wall $302x$. Namely, the terminal groups $40x$ and $40y$ are so arranged as to sandwich the package $30x$. In more detail, as illustrated in FIGS. 6 and 7, terminals $41x$, $42x$, $43x$ and $45x$ arranged on the side of the side wall $301x$ supply electric currents to a cooler $50x$ and a temperature detector $90x$. Terminals $43y$ and $45y$ arranged on the side of the side wall $302x$ supply electric currents to an SOA element $80x$. As this, between the terminals $41x$, $42x$, $43x$ and $45x$ supplying electric currents to the cooler $50x$ and the temperature detector $90x$, and the terminals $43y$ and $45y$ supplying electric currents to the SOA element $80x$, the package $30x$ is arranged, which causes an increase in dimensions of the optical component $20x$.

A reason why the terminal groups 40x and 40y are arranged in this way is as follows. As illustrated in FIG. 7, in the optical amplification module 1x, patterns 71x and 73x on a carrier 70x are arranged on the side of the terminal group 40y, while patterns 75x and 77x are arranged on the side of the terminal group 40x. The patterns 71x and 73x are conductively connected to terminals 43y and 45y in the terminal group 40y by wires, while the patterns 75x and 77x are conductively connected to terminals 43x and 45x in the terminal group 40x. The patterns 75x and 77x conductively connected to the temperature detector 90x are on the upper side of the carrier 70x, while the patterns 71x and 73x conductively connected to the SOA element 80x are on the lower side of the carrier 70x. As this, the patterns 71x and 73x, and the patterns 75x and 77x are dispersively arranged. In addition, the terminal groups 40x and 40y are arranged on both sides of the package 30x, which causes an increase in dimensions of the optical component 20x.

In the optical amplification module 1 according to this embodiment, the terminals 41 to 46 supplying electric power to the cooler 50, the SOA element 80 and the temperature detector 90 are arranged in parallel and collected on the side of the same side wall 301 on the package 30, as illustrated in FIGS. 2 and 3. No terminals are disposed on the side of the side walls 302 to 304. A reason of this is that, since the patterns 71, 73, 76 and 77 are collected on the side of the terminal group 40 as illustrated in FIG. 4, there is no need for a plurality of terminals to be arranged on both sides of the package 30. Therefore, the optical component 20 is reduced in dimensions, which allows the entire optical amplification module 1 to be reduced in dimensions.

In the optical amplification module 1x, the terminal groups 40x and 40y are arranged on both sides of the package 30x, and the connectors 31x and 31y are arranged on sides on which the terminal groups 40x and 40y are not disposed. As a result, the terminal groups 40x and 40y, and the connectors 31x and 31y are arranged so as to radially extend from the package 30x, which causes a further increase in dimensions of the optical component 20x. An opening 12x has to be larger than the optical component 20x, which causes a further increase in dimensions of a printed substrate 10x. As this, the optical amplification module 1x is increased in dimensions.

On the other hand, in the optical amplification module 1 according to this embodiment, the connectors 31a and 31b are arranged opposite to the terminal group 40 with the package 30 therebetween, the connectors 31a and 31b extending in a direction opposite to a direction in which the terminals 41 to 47 extend as illustrated in FIGS. 1A and 2, which allows the optical component to be laterally reduced in dimensions. The leg part 38a is disposed so as to be in the same row as the connectors 31a and 31b, and extends in the same direction as the connectors 31a and 31b. The leg parts 38b and 38c are arranged so as to be in the same row as the terminals 41 to 47, and extend in the same direction as the terminals 41 to 47. Whereby, the optical component 20 is laterally reduced in dimensions.

Next, a first modification of the carrier 70 will be described.

Figures 8A, 8B:
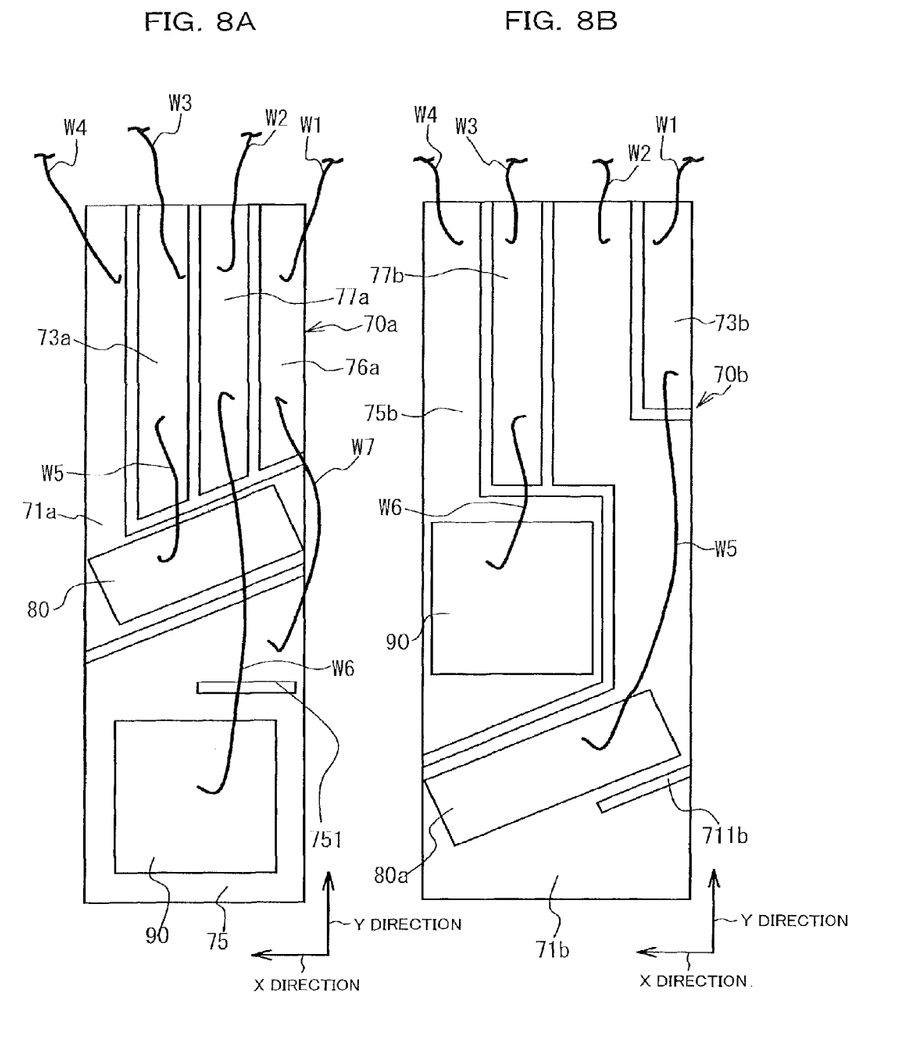
FIG. 8A is a diagram illustrating a carrier according to a first modification.
FIG. 8B is a diagram illustrating a carrier according to a second modification.

FIG. 8A is a diagram illustrating a carrier 70a according to a first modification. Like reference characters designate like or corresponding parts in the drawings, duplicated descriptions of which will be omitted here. As illustrated in FIG. 8A, patterns 76a, 77a, 73a and 71a are arranged in the x direction. Patterns 76a, 77a, 73a and 71a extend up to an edge of the carrier 70a along which a terminal group 40 is arranged. When a certain degree of the whole width of the carrier 70a can be secured, the four patterns can be arranged in parallel as illustrated. The patterns 76a, 77a, 73a and 71a are conductively connected to terminals 43 to 46 by wires W1 to W4, respectively.

FIG. 8B is a diagram illustrating a carrier 70b according to a second modification.

Unlike the embodiment and the first modification above, a positional relationship between an SOA element 80a and a temperature detector 90 is reversal in the second modification. The SOA element 80a is longitudinally longer than the above-described SOA element 80. A carrier 70b is laterally wider than the afore-mentioned carriers 70 and 70a. Patterns 73b, 71b, 77b and 75b are arranged in parallel. In more detail, the pattern 71b on which the SOA element 80a is mounted and the pattern 75b on which the temperature detector 90 is mounted both extend up to an edge of the carrier 70b along which the terminal group 40 is disposed. Whereby, there is no need to conductively connect the patterns on the carrier 70b to each other by a wire. This is effective to reduce the number of wires attached on the carrier 70b, which can prevent a contact of the wires to each other. A notched part 711b functions as an index illustrating an appropriate attitude of the SOA element 80a when the SOA element 80a is mounted on the pattern 71b. Incidentally, the patterns 73b, 71b, 77b and 75b are conductively connected to the terminals 43 to 46 by wires W1 to W4, respectively.

Figure 9A:
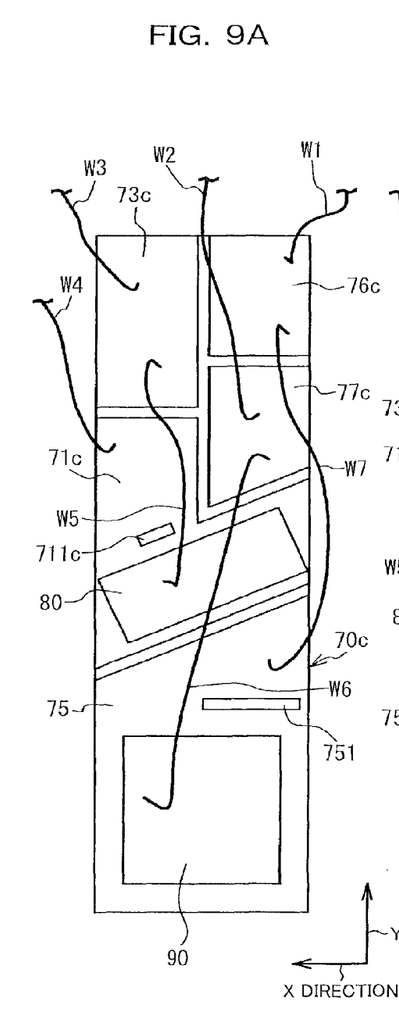
FIG. 9A is a diagram illustrating a carrier according to a third modification.

FIG. 9A is a diagram illustrating a carrier 70c according to a third modification.

Patterns 77c and 76c are arranged in the y direction, and patterns 71c and 73c are arranged in the y direction, as well. On the other hand, patterns 76c and 73c are arranged in the x direction. Patterns 75 and 71c are arranged in the y direction. A notched part 711c is formed in the pattern 71c. The notched part 711c is formed between a portion on the pattern 71c to which a wire W4 is connected and an SOA element 80. The notched part 711c prevents solder used when the SOA element 80 is mounted on the pattern 71c from flowing to a portion at which the wire W4 is connected. The patterns 76c, 77c, 73c and 71c are conductively connected to the terminals 43 to 46 by the wires W1 to W4, respectively.

Figure 9B:
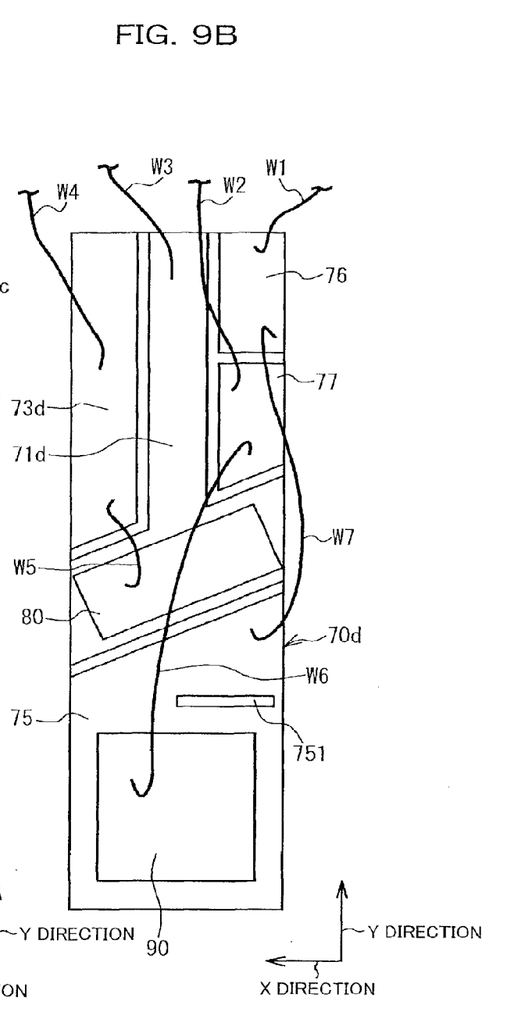
FIG. 9B is a diagram illustrating a carrier according to a fourth modification.

FIG. 9B is a diagram illustrating a carrier 70d according to a fourth modification.

A pattern 71d is placed between a pattern 73d, and patterns 76 and 77. To the pattern 73d, a wire W5 conductively connected to an electrode of an SOA element 80 is connected. To the pattern 76, a wire W7 electrically connected to the pattern 75 is connected. To the pattern 77, a wire W6 conductively connected to an electrode of a temperature detector 90 is connected. As this, the patterns 73d, 76 and 77 are conductively connected to the wires W5, W7 and W6, respectively. To the pattern 71d, no wire excepting the wire W3 is conductively connected. By placing the pattern 71d between the pattern 73d, and the patterns 76 and 77, the wire W5, and the wires W7 and W6 can be separated as much as possible to avoid a contact therebetween. Incidentally, the patterns 76, 77, 71d and 73d are conductively connected to the terminals 43 to 46 by the wires W1 to W4, respectively.

In the afore-described embodiment, the optical fibers 100a and 100b undergo the extra length processing. However, the embodiment is not limited to this example. The optical fibers may be immune from the extra length processing.

The optical amplifying module 1 according to the embodiment is used in an electronic apparatus. The electronic apparatus is, for example, an optical network unit (ONU) used in a passive optical network (PON), or an optical transmission device.

Figure 10:
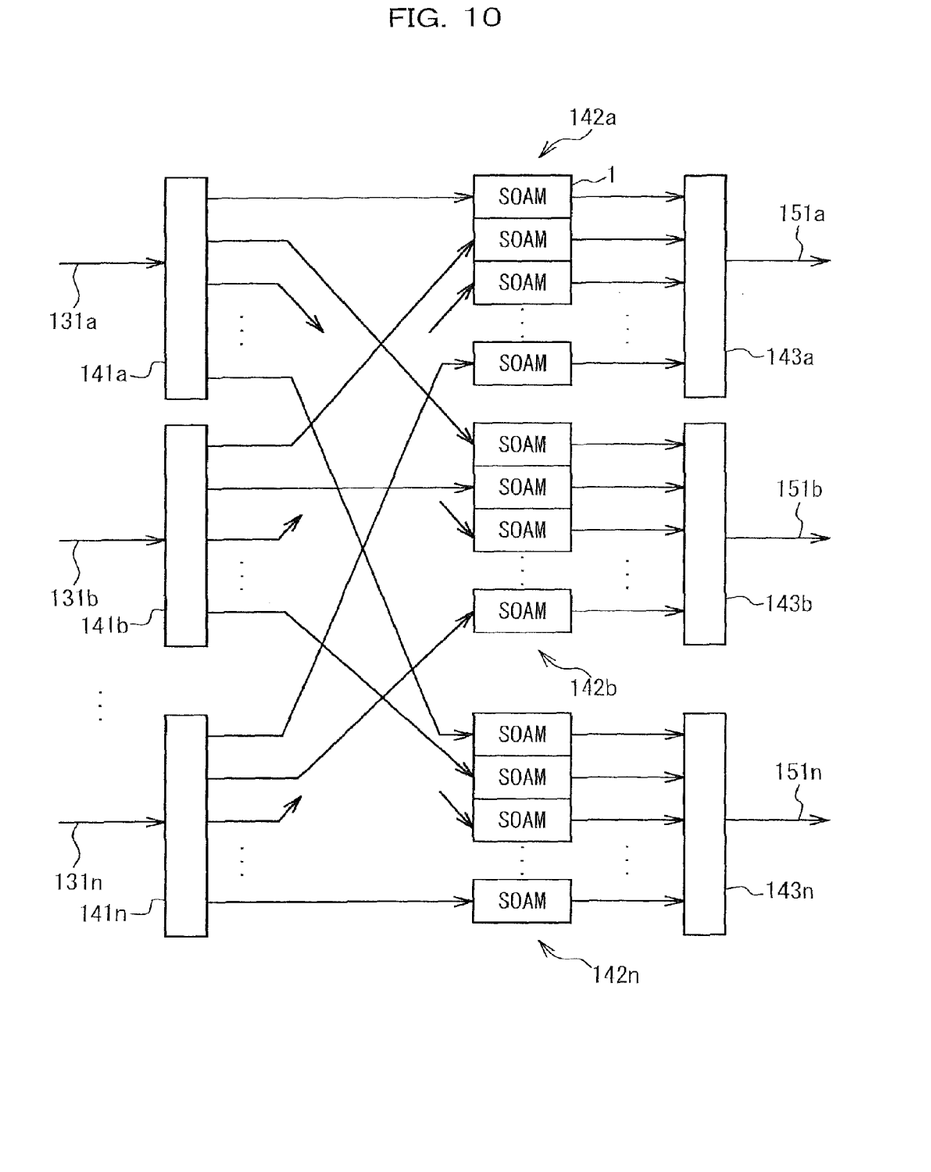
FIGS. 10 and 11 are diagrams illustrating optical switch devices.
Figure 11:
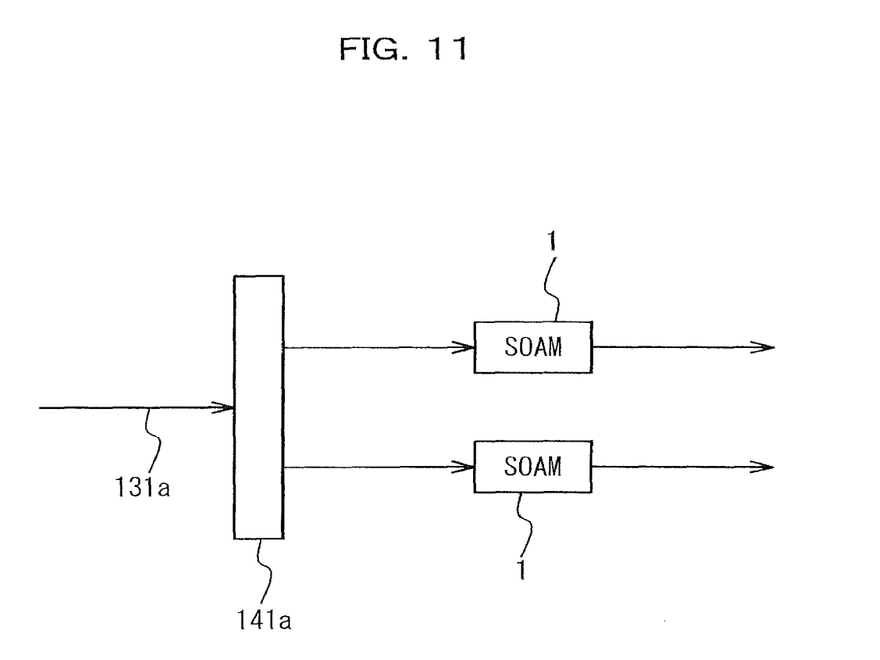

Next, an optical switch device employing the optical amplification module according to this embodiment will be described. FIGS. 10 and 11 are diagrams illustrating optical switch devices. FIG. 10 is a diagram illustrating a matrix type optical switch device, in which a plurality of optical amplification modules can be used. The matrix type optical switch device has a plurality of optical dividing couplers (optical dividing units) 141a to 141n, optical amplification module groups 142a to 142n, optical combining couplers (optical combining unit) 143a to 143n. Optical input ports 131a to 131n are provided to the optical dividing couplers 141a to 141n, respectively. Similarly, optical output ports 151a to 151n are provided to the optical combining couplers (optical combining units) 143a to 143n, respectively. Each of the optical dividing couplers 141a to 141n has n output ports. Each of the optical amplification modules in the optical amplification module group 142a is connected to one of output ports of the optical dividing couplers 141a to 141n. Each of the optical amplification modules in the optical amplification module group 142n is connected to another one of the output ports of the optical dividing couplers 141a to 141n. Outputs of the optical amplification module group 142a are connected to the optical combining coupler 143a. Likewise, outputs of the optical amplification module group 142n are connected to the optical combining coupler 143n.

One of two optical fibers of each optical amplification module is optically connected to an output port of any one of the optical dividing couplers 141a to 141n. The other optical fiber of each optical amplification module is optically connected to an input port of any one of the optical combining couplers 143a to 143n. Whereby, each optical amplification module is optically connected to any one of the optical input ports 131a to 131n, and optically connected to any one of the optical output ports 151a to 151n.

An SOA element in each of the optical amplification module groups 142a to 142n is switched in accordance with presence/absence of a driving current from a driving circuit group. Namely, a light beam inputted to the optical amplification module is outputted as an output light beam from the optical amplification module or is cut off in accordance with the driving current from the driving circuit group. As this, each optical amplification module functions as an optical gate. The optical combining couplers 143a to 143n are of n inputs and one output. Each of the optical combining couplers 143a to 143n has optical input ports, the number of which is equal to the number of the optical dividing couplers 141a to 141n. Each of the optical combining couplers 143a to 143n outputs light beams inputted from the optical input ports from one optical output port.

As above, by employing the optical amplification module according to the embodiment in the matrix type optical switch device including a plurality of optical amplification modules, the dimensions of the matrix type optical switch device can be reduced. On such occasion, it is only necessary that at least one of the plural optical amplification modules used in the matrix type optical switch device is the optical amplification module according to the embodiment.

Meanwhile, the printed substrate employed in each optical amplification module can be shared in the above matrix type optical switch device.

FIG. 11 illustrates another example of the optical switch device. The optical switch device in FIG. 11 has a single optical dividing coupler 141a and two optical amplification modules 1. In the optical switch capable of switching an optical path of a light beam inputted to the single optical dividing coupler 141a, the optical amplification module according to the embodiment can be employed.

Alternatively, in an optical switch device employing a single optical amplification module, the optical amplification module according to the embodiment can be employed. In such case, the optical amplification module functions as an optical gate outputting an inputted light beam or cutting off the same.

Accordingly, the embodiments can provide an optical amplification module with reduced dimensions and an optical switch device having such the optical amplification module.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical amplification module comprising:
   a semiconductor optical amplifier;
   a package that accommodates the semiconductor optical amplifier;
   a first connector and a second connector that hold respective collimator lenses and are arranged in parallel on the package; and
   a first optical fiber and a second optical fiber that are connected to the first connector and the second connector, respectively,
   wherein a sum of bend radii of the first optical fiber and the second optical fiber being greater than a space between the first connector and the second connector.

2. The optical amplification module according to claim 1, further comprising:
   a temperature detector and a cooler that are accommodated in the package; and
   a plurality of terminals that supply electric current to the semiconductor optical amplifier, the temperature detector and the cooler, and penetrate through the package and are arranged in parallel;
   the plurality of terminals being arranged at a first end of the package, the first and second connectors being arranged at a second end of the package, and the first end and the second end being opposite to each other.

3. The optical amplification module according to claim 2 further comprising: a carrier that is accommodated in the package and on which the semiconductor optical amplifier and the temperature detector are mounted; the carrier including a first pattern and a second pattern conductively connected to the semiconductor optical amplifier and disposed on a side closer to the plurality of terminals than the semiconductor optical amplifier, and a third pattern and a fourth pattern conductively connected to the temperature detector and disposed on a side closer to the plurality of terminals than the temperature detector.

4. An optical switch device comprising:
   a first optical amplification module and a second optical amplification module; and
   an optical splitter capable of distributing inputted light to the first and second optical amplification modules;
   at least one of the first optical amplification module and the second optical amplification module has a semiconductor optical amplifier, a package accommodating the semiconductor optical amplifier, a first connector and a second connector holding respective collimator lenses and arranged in parallel on the package, and a first optical fiber and a second optical fiber connected to the first connector and the second connector, respectively;

a sum of bend radii of the first optical fiber and the second optical fiber being greater than a space between the first connector and the second connector.

* * * * *